(12) United States Patent
Wang et al.

(10) Patent No.: US 11,929,313 B2
(45) Date of Patent: Mar. 12, 2024

(54) CHIP PACKAGE STRUCTURE AND METHOD FOR MANUFACTURING THE SAME, AND MODULE

(71) Applicant: Shanghai Tianma Micro-Electronics Co., Ltd., Shanghai (CN)

(72) Inventors: Mingyu Wang, Shanghai (CN); Kerui Xi, Shanghai (CN); Xuhui Peng, Shanghai (CN); Feng Qin, Shanghai (CN); Jie Zhang, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 179 days.

(21) Appl. No.: 17/532,248

(22) Filed: Nov. 22, 2021

(65) Prior Publication Data
US 2022/0084923 A1 Mar. 17, 2022

(30) Foreign Application Priority Data
Jun. 30, 2021 (CN) .......................... 202110732782.8

(51) Int. Cl.
*H01L 23/498* (2006.01)
*H01L 23/00* (2006.01)
(Continued)

(52) U.S. Cl.
CPC ........ *H01L 23/49816* (2013.01); *H01L 23/15* (2013.01); *H01L 23/32* (2013.01);
(Continued)

(58) Field of Classification Search
CPC ... H01L 23/49816; H01L 23/15; H01L 23/32; H01L 23/49838; H01L 24/16;
(Continued)

(56) References Cited

U.S. PATENT DOCUMENTS 6,498,624 B1 * 12/2002 Ogura .................... G02B 17/04
348/335
2012/0280386 A1 * 11/2012 Sato .................. H01L 23/49517
257/772

FOREIGN PATENT DOCUMENTS

CN 101266990 A 9/2008
CN 105244360 A 1/2016
(Continued)

OTHER PUBLICATIONS

English translation of the First Chinese Office Action dated Aug. 30, 2023, issued in the corresponding Chinese Application No. 202110732782.8, filed on Jun. 30, 2021, 12 pages.

*Primary Examiner* — Georgia Y Epps
*Assistant Examiner* — Don J Williams
(74) *Attorney, Agent, or Firm* — CHRISTENSEN O'CONNOR JOHNSON KINDNESS PLLC

(57) ABSTRACT

A chip package structure, manufacturing method thereof, and module are described. In an embodiment, the chip package structure includes: a substrate, a wiring layer, a chip, and a second conductive bump, wherein, in an embodiment, the substrate includes a first region and a second region surrounding the first region, and the wiring layer is located on side of the substrate and includes metal wire, wherein at least part of a metal wire is in contact with the substrate in direction perpendicular to the substrate, and the metal wire overlaps with the second region, wherein the chip is located on side of the wiring layer facing away from the substrate, and the chip corresponds to the first region. In an embodiment, a first conductive bump is provided on side of the chip facing away from the substrate and is electrically connected to the metal wire.

19 Claims, 10 Drawing Sheets

(51) Int. Cl.
*H01L 23/15* (2006.01)
*H01L 23/32* (2006.01)
*H01L 31/02* (2006.01)
*H04N 23/54* (2023.01)

(52) U.S. Cl.
CPC ........ *H01L 23/49838* (2013.01); *H01L 24/16* (2013.01); *H01L 24/73* (2013.01); *H01L 24/81* (2013.01); *H01L 31/02002* (2013.01); *H04N 23/54* (2023.01); *H01L 2224/16225* (2013.01); *H01L 2224/32225* (2013.01); *H01L 2224/73204* (2013.01)

(58) Field of Classification Search
CPC ... H01L 24/73; H01L 24/81; H01L 31/02002; H01L 2224/16225; H01L 2224/32225; H01L 2224/73204
See application file for complete search history.

(56) References Cited

FOREIGN PATENT DOCUMENTS

| | | |
|---|---|---|
| CN | 105977225 A | 9/2016 |
| CN | 111276503 A | 6/2020 |

\* cited by examiner

CHIP PACKAGE STRUCTURE AND METHOD FOR MANUFACTURING THE SAME, AND MODULE

CROSS-REFERENCE TO RELATED APPLICATIONS

The present application claims priority to Chinese Patent Application No. 202110732782.8, filed on Jun. 30, 2021, the content of which is incorporated herein by reference in its entirety.

TECHNICAL FIELD

The present disclosure relates to the field of semiconductor technology, in particular to a chip package structure, a method for manufacturing the chip package structure, and a module.

BACKGROUND

Conventional image sensor chips are generally packaged by manufacturing, using plastic or ceramic as a base material, a base with a groove and including a groove and a dam surrounding the groove; disposing a chip in the groove; and transmitting a physical signal of the chip to the dam through a lead, and thus transmitting the physical signal to the external circuit. However, it is difficult to make the conventional chip package to achieve a sufficiently light thickness and a sufficiently compact size, which is not conducive to high-density integration.

SUMMARY

In a first aspect, an embodiment of the present disclosure provides a chip package structure. In an embodiment, the chip package structure includes a substrate including a first region and a second region surrounding the first region, a wiring layer located on a side of the substrate, a chip located on a side of the wiring layer facing away from the substrate, and a second conductive bump. In an embodiment, the wiring layer includes at least one metal wire, at least part of one of the at least one metal wire is in contact with the substrate, and the at least one metal wire overlap with the second region in a direction perpendicular to the substrate. In an embodiment, the chip corresponds to the first region and includes a first conductive bump provided on a side of the chip facing towards to the substrate. In an embodiment, the first conductive bump is electrically connected to one of the at least one metal wire, the second conductive bump is electrically connected to one of the at least one metal wire, and the second conductive bump does not overlap with the chip in the direction perpendicular to the substrate.

In a second aspect, an embodiment of the present disclosure provides a module. In an embodiment, the module includes a circuit board and the chip package structure provided by the present disclosure, and the chip package structure is electrically connected to the circuit board through the second conductive bump.

In a third aspect, an embodiment of the present disclosure provides a method for manufacturing a chip package structure. In an embodiment, the method includes: providing a substrate including a first region and a second region surrounding the first region; fabricating a wiring layer on the substrate by a film forming process, the wiring layer including at least one metal wire, at least part of one of the at least one metal wire being in contact with the substrate, and the at least one metal wire overlapping the second region in a direction perpendicular to the substrate; providing a chip with a first conductive bump on a side of the chip; attaching the wiring layer and the chip with the first conductive bump, the chip corresponding to the first region, and the first conductive bump being electrically connected to one of the at least one metal wire; and fabricating a second conductive bump, the second conductive bump being electrically connected to one of the at least one metal wire.

BRIEF DESCRIPTION OF DRAWINGS

In order to more clearly illustrate technical solutions of embodiments of the present disclosure or the technical solutions in the related art, the accompanying drawings used in the embodiments or the related art are briefly described below. The drawings described below are some embodiments of the present disclosure. For those of ordinary skill in the art, other drawings can be obtained from these drawings without creative efforts.

DESCRIPTION OF EMBODIMENTS

In order to better understand the purpose, technical solutions, and advantages of the present disclosure, the embodiments of the present disclosure will be clearly and completely described with reference to the drawings. It should be clear that the described embodiments are some embodiments of the present disclosure, not all embodiments. Based on the embodiments of the present disclosure, all other embodiments obtained by those of ordinary skill in the art without creative efforts shall fall within the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

Some embodiments of the present disclosure provide a chip package structure, wherein a wiring layer is directly formed on a substrate, and the chip and a metal wire in the wiring layer are connected to each other, and electrical signals of the chip are transmitted to an external circuit through the metal wire during application. In an embodiment, the substrate is a glass substrate. Compared with a plastic substrate or a ceramic substrate, the substrate can be made thinner, and the chip package structure can be thinned. Taking a photosensitive chip as an example, when assembling into a camera or other imaging device, the substrate can be directly used as a supporting base, and other structures can be directly formed on the substrate, without an additional rigid base, which can also simplify a manufacturing process of a module structure.

Figure 1:
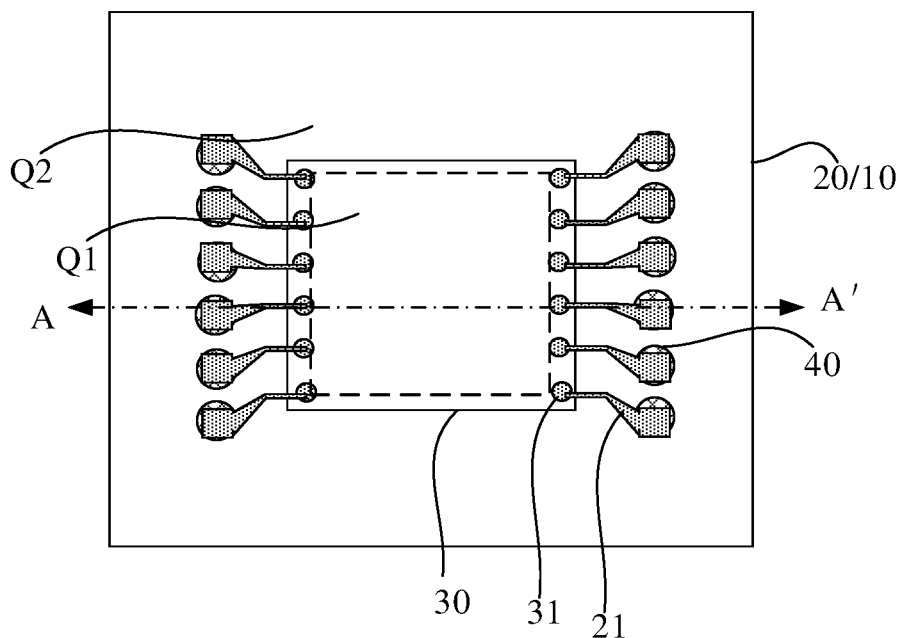
FIG. 1 is a schematic diagram of a chip package structure provided by an embodiment of the present disclosure.

An embodiment of the present disclosure provides a chip package structure. FIG. 1 is a schematic diagram of the chip package structure provided by an embodiment of the present disclosure, and FIG. 2 is a schematic cross-sectional view along line A-A' in FIG. 1.

Figure 2:
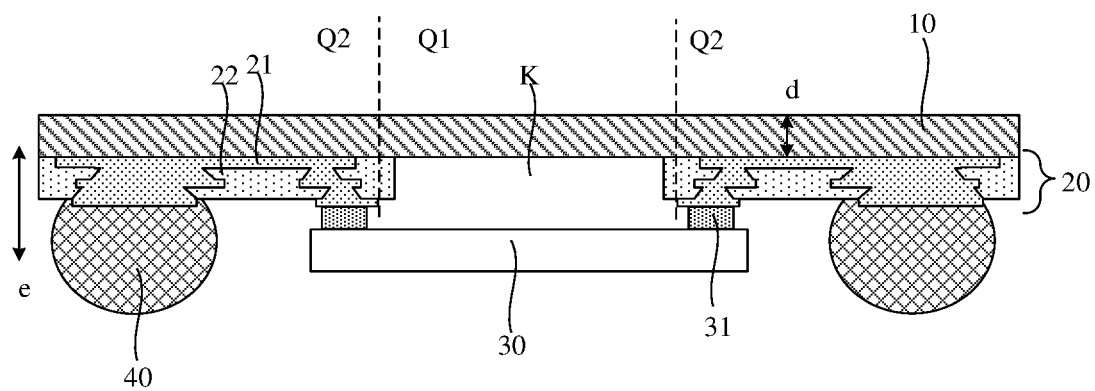
FIG. 2 is a schematic cross-sectional view along line A-A' in FIG. 1 according to an embodiment of the present disclosure.

With reference to FIG. 1 and FIG. 2, the chip package structure includes a substrate 10, a wiring layer 20, a chip 30, and a second conductive bump 40. FIG. 1 is a top view of the chip 30 viewed from the substrate 10.

The substrate 10 has a first region Q1 and a second region Q2 surrounding the first region Q1.

The wiring layer 20 is located on a side of the substrate 10 and includes a metal wire 21. At least part of the metal wire 21 is in contact with the substrate 10, that is to say, the metal wire 21 is directly formed on the substrate 10. In this embodiment of the present disclosure, the substrate 10 and the wiring layer 20 are not adhered to each other through an adhesive layer. In an embodiment, during production, the substrate 10 is used as a base, and the metal wire 21 is directly fabricated by a film forming process. The film forming process can include magnetron sputtering, coating and electroplating processes.

In a direction e perpendicular to the substrate 10, the metal wire 21 overlaps with the second region Q2, that is, an orthographic projection of the metal wire 21 on the substrate 10 is located in the second region Q2. In an embodiment, the orthographic projection of the metal wire 21 on the substrate 10 is spaced from the first region Q1, that is, the metal wire 21 is not provided at a position corresponding to the first region Q1.

The chip 30 is located on a side of the wiring layer 20 facing away from the substrate 10 and corresponds to the first region Q1. In an embodiment, the chip 30 overlaps with the first region Q1 of the substrate 10, for example, the orthographic projection of the chip 30 on the substrate 10 covers the first region Q1. The chip 30 includes a first conductive bump 31 provided on a side of the chip 30 facing towards the substrate 10, and the first conductive bump 31 is electrically connected to the metal wire 21. In an embodiment, the chip 30 includes a plurality of first conductive bumps 31, some first conductive bumps 31 of the plurality of first conductive bumps 31 are signal input ports, and another some first conductive bumps 31 of the plurality of first conductive bumps 31 are signal output ports.

The second conductive bump 40 is electrically connected to the metal wire 21, and the second conductive bump 40 does not overlap with the chip 30 in the direction e perpendicular to the substrate 10. A physical signal of the chip 30 is transmitted to the metal wire 21 through the first conductive bump 31 and then transmitted to the second conductive bump 40 through the metal wire 21. In use, the second conductive bump 40 is electrically connected to a circuit board to realize the connection between the chip 30 and the external circuit. In an embodiment, the second conductive bump 40 is a solder ball.

The metal wire 21 can be made of one metal layer, two metal layers or multiple metal layers. The metal wire 21 is used as one of the media for transmitting the physical signal of the chip 30 to the external circuit. The wiring layer 20 can include a first pad and a second pad that are fabricated in a same process as the metal wire 21. One end of the metal wire 21 is connected to the second pad, and another end of the metal wire 21 is connected to the first pad. The first pad is bound to the second conductive bump 40, the second pad is bound to the first conductive bump 31, and in subsequent applications, the second conductive bump 40 is configured to be bound to the circuit board, and the second pad is configured to be bound to the input/output port of the chip 30. A size of the input/output port of the chip 30 will be smaller than a size of a pad on the circuit board, so a size of the second pad in the wiring layer can match a size of the first conductive bump 31 on the chip 30, and the size of the second pad can be relatively small. If the size of the pad on the circuit board is relatively large, the size of the second pad for being bound to the second conductive bump 40 in the wiring layer can match the size of the pad on the circuit board, and the size of the first pad can be relatively large.

In the chip package structure provided by the embodiment of the present disclosure, at least part of the metal wire in the wiring layer is in contact with the substrate, the chip is connected to the metal wire in the wiring layer, and the physical signal of the chip is transmitted to the second conductive bump on the substrate through the metal wire, thereby packaging the chip. During production, the wiring layer can be formed by using the substrate as the base by the film forming process, and the wiring layer has a high manufacturing precision, which can ensure the accuracy of the chip when the chip is aligned with and bounded to the wiring layer. In the present disclosure, it is avoided that the wiring layer is additionally fabricated and then attached to the substrate, which can avoid poor alignment of the wiring layer and the substrate, thereby avoiding poor alignment of the wiring layer and the chip and thus not affecting the yield. In the present disclosure, the substrate and the wiring layer do not need to be adhered to each other by an adhesive layer, which is beneficial to the reduction of the overall thickness of the chip package structure. Compared to conventional processes and devices, there is no need to use a thicker base with a groove to carry the chip, and there is no need to fabricate a package glass layer to seal the chip inside the groove. The chip package structure provided by the embodiment of the present disclosure has a lighter and thinner thickness and a more compact size, which is conducive to high-density integrated applications.

As shown in FIG. 2, the substrate 10 has a thickness of d, where $0.05$ mm$\leq$d$\leq$0.7 mm. In the embodiment of the present disclosure, the thickness of the substrate 10 satisfies a certain range, and its maximum thickness is only 0.7 mm, which is significantly smaller than a thickness of a base made of plastic or ceramic substrates in the related art. Compared to the prior art, the embodiment of the present disclosure provides a lighter and thinner chip package structure. The thickness of the substrate 10 is not smaller than 0.05 mm, which enables the substrate 10 to have a certain load-bearing capacity and can meet the requirements of subsequent module applications.

In an embodiment, the substrate 10 includes a light-transmitting substrate, such as a glass substrate, a transparent resin substrate, a transparent polyvinyl chloride (PVC) substrate, a light-transmitting polyimide (PI) substrate, or the like. Compared with conventional processes that use a base made of plastic substrate or ceramic substrate to encapsulate the chip in the groove, the embodiments of the present disclosure not only provide a lighter and thinner chip package structure, but also provides a light-transmitting substrate with a better light-transmittance. When packaging the photosensitive chip, the processes of the present disclosure can meet the light-transmitting requirements. When assembling into a module, there is no need to provide an additional light-transmitting carrier base. The module also reduces a thickness of a layer of the substrate, which not only simplifies the manufacturing process of the module structure, but also reduces the overall thickness of the module.

Figure 3:
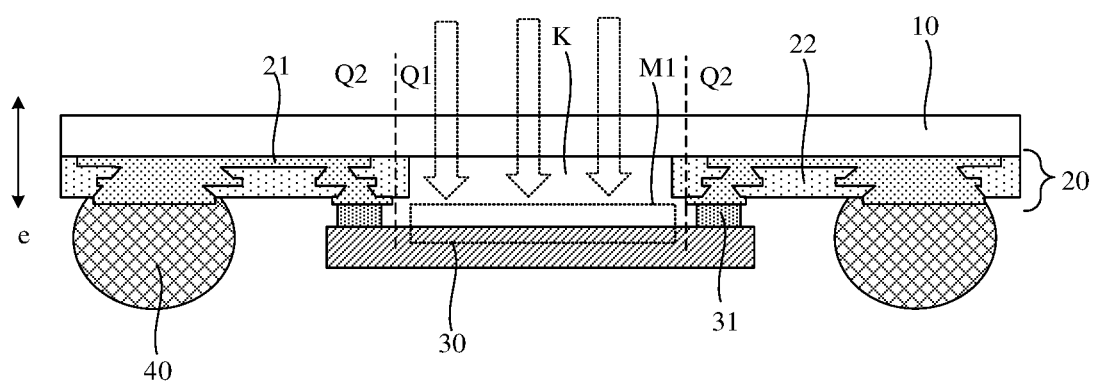
FIG. 3 is a schematic cross-sectional view of another chip package structure provided by an embodiment of the present disclosure.

Based on the above embodiment, FIG. 3 is a schematic cross-sectional view of another chip package structure provided by an embodiment of the present disclosure. As shown in FIG. 3, the chip 30 includes a photosensitive region M1 located on the side of the chip 30 facing towards the substrate 10. In an embodiment, the chip 30 includes a photosensitive surface (not shown in the figure), and the photosensitive surface includes the photosensitive region M1. The photosensitive region M1 is opposite to the first region Q1. In the direction e perpendicular to the substrate 10, the photosensitive region M1 and the second region Q2 do not overlap. In an embodiment, the chip 30 is a photosensitive chip. The direction indicated by the arrow in FIG. 3 is the light incident direction. The photosensitive region M1 is opposite to the first region Q1. In use, light passes through the substrate 10 and then irradiates the photosensitive region M1, and then the chip 30 converts a light signal to an electrical signal and transmits the electrical signal to the external circuit through the first conductive bump 31, the metal wire 21, and the second conductive bump 40. The embodiment of the present disclosure can realize a thin package of the chip, and the photosensitive region M1 of the chip 30 is located on a side facing towards the substrate 10. When the chip package structure is assembled into a module, the substrate 10 can be used as a supporting base to make other structures. There is no need to provide an additional supporting base, and the thickness of a layer of a base can be reduced for the module, which not only simplifies the manufacturing process of the module structure, but also facilitates the thinning of the thickness of the module. If the photosensitive region M1 and the second region Q2 of the substrate 10 do not overlap, the photosensitive region M1 does not overlap with the metal wire 21 in the wiring layer 20, thereby preventing the metal wire 21 from shielding light incident to the photosensitive region M1. This increases an amount of light received by the photosensitive region M1 of the chip 30 in application, and improving the performance of the chip package structure.

Figure 4:
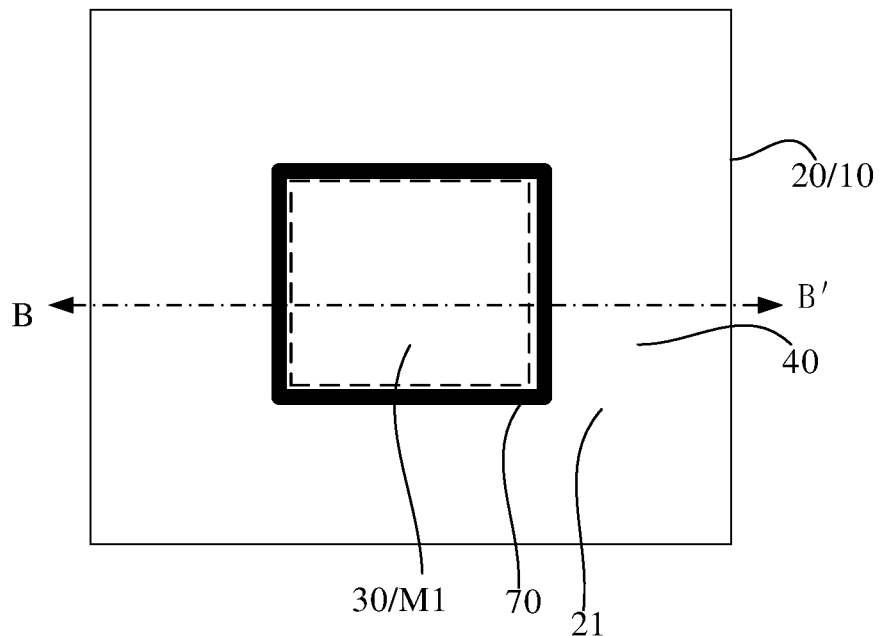
FIG. 4 is a schematic diagram of another chip package structure provided by an embodiment of the present disclosure.
Figure 5:
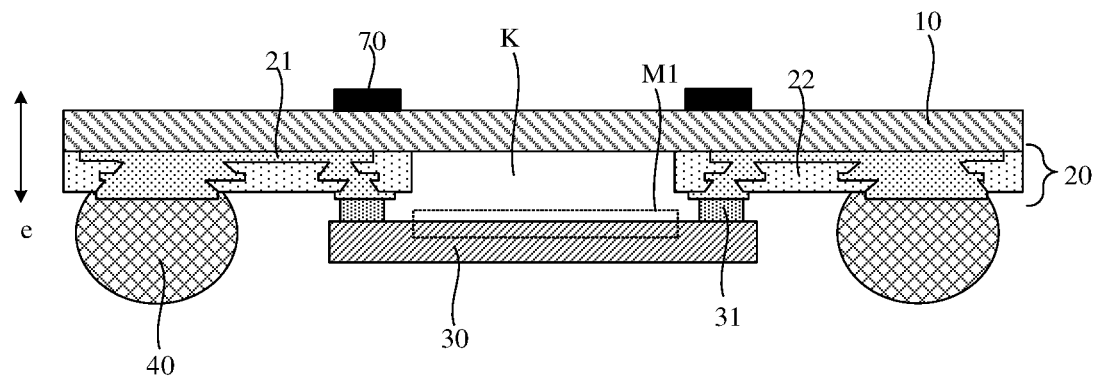
FIG. 5 is a schematic cross-sectional view along line B-B' in FIG. 4 according to an embodiment of the present disclosure.

In another embodiment, FIG. 4 is a schematic diagram of another chip package structure provided by an embodiment of the present disclosure, and FIG. 5 is a schematic cross-sectional diagram along line B-B' in FIG. 4.

FIG. 4 is a top view of the chip 30 viewed from the substrate 10. The chip package structure further includes a light shielding portion 70 located on a side of the substrate 10 facing away from the chip 30, and the chip 30 includes a photosensitive region M1. An orthographic projection of the light-shielding portion 70 on a plane of the photosensitive region M1 surrounds the photosensitive region M1 and does not overlap with the photosensitive region M1. Such configuration can shield stray light incident to the photosensitive region M1 by the light shielding portion 70, so as to ensure an imaging quality after the chip receives the light signal.

Figure 6:
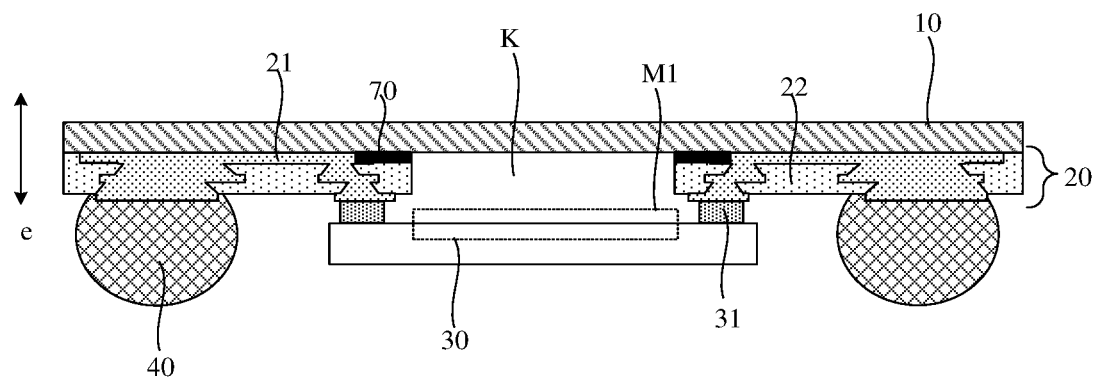
FIG. 6 is a schematic diagram of another chip package structure provided by an embodiment of the present disclosure.

In another embodiment, FIG. 6 is a schematic diagram of another chip package structure provided by an embodiment of the present disclosure. As shown in FIG. 6, the light shielding portion 70 is located on the side of the substrate 10 facing towards the chip 30.

Figure 7:
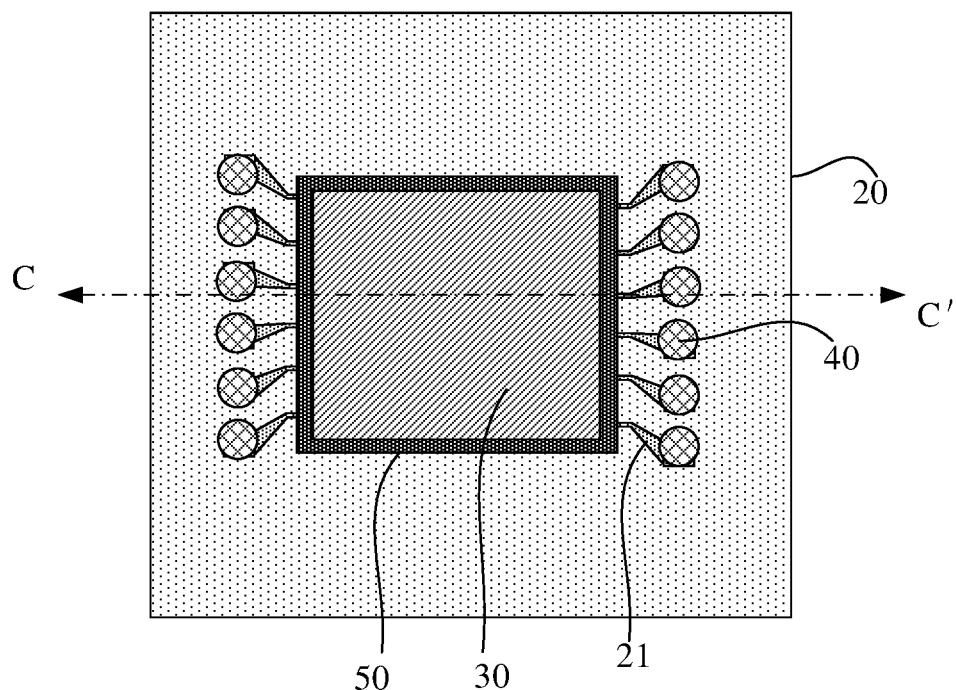
FIG. 7 is a schematic diagram of another chip package structure provided by an embodiment of the present disclosure.
Figure 8:
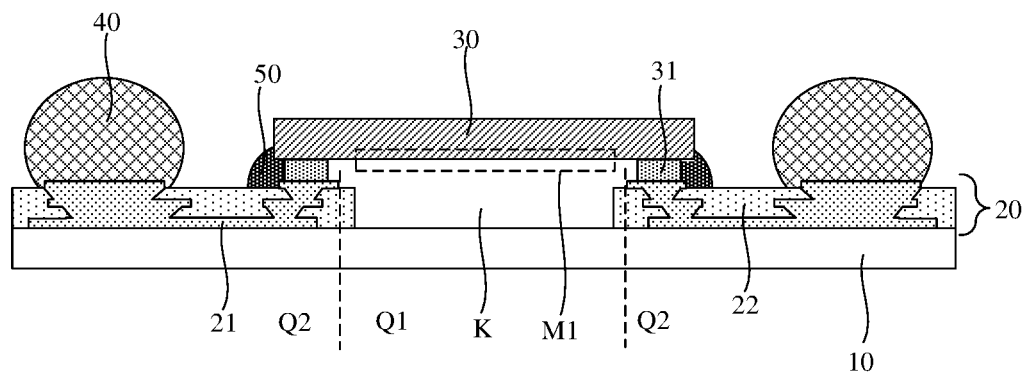
FIG. 8 is a schematic cross-sectional view along C-C' in FIG. 7 according to an embodiment of the present disclosure.

FIG. 7 is a schematic diagram of another chip package structure provided by an embodiment of the present disclosure, and FIG. 8 is a schematic cross-sectional view along CC' in FIG. 7. FIG. 7 is a schematic diagram viewing from the chip to the substrate.

With reference to FIG. 7 and FIG. 8, the chip package structure further includes a filling adhesive 51 that is filled on peripheral edges of the chip 30 and in contact with the wiring layer 20. The filling adhesive 51 can not only make the adhesion between the chip 30 and the wiring layer 20 more reliable, but also prevent impurities from entering a region between the chip 30 and the substrate 10. When a surface of the chip 30 facing towards the substrate 10 is a functional surface (such as the photosensitive region), the filling adhesive can protect the functional surface.

In an embodiment, a manufacturing material of the filling adhesive 51 includes a light-shielding material, or a light-absorbing material. Such configuration can achieve a light-shielding effect or a light-absorbing effect, and avoid light leakage at the peripheral edges of the chip 30 connected to the wiring layer 20, and can also prevent entering of external light from interfering with the imaging of the chip 30.

Figure 9:
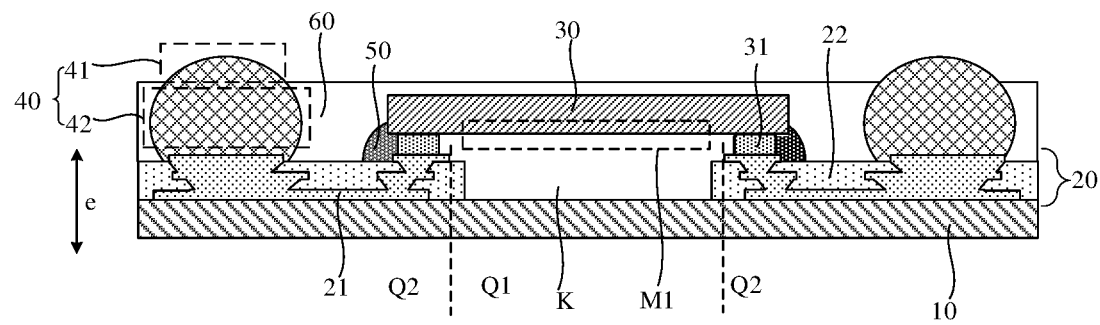
FIG. 9 is a schematic cross-sectional view of another chip package structure provided by an embodiment of the present disclosure.

In another embodiment, FIG. 9 is a schematic cross-sectional view of another chip package structure provided by an embodiment of the present disclosure. As shown in FIG. 9, the chip packaging structure further includes an encapsulation layer 60, the second conductive bump 40 includes a first end 41 and a second end 42 that are connected to each other. The first end 41 is located at a side of the second end 42 away from the substrate 10, the encapsulation layer 60 encapsulates the chip 30, and the second end 42 is embedded in the encapsulation layer 60. The first end 41 is exposed outside the encapsulation layer 60, and the encapsulation layer 60 also covers other regions on the wiring layer 20. The encapsulation layer 60 encapsulates and protects the entire chip 30 on the side of the chip 30 facing away from the substrate 10, and the encapsulation layer 60 wraps a part of the second conductive bump 40 to ensure a firm and reliable connection between the second conductive bump 40 and the metal wire 21. When assembled into a module structure, the first end 41 exposed outside the encapsulation layer 60 is equivalent to a reserved connection port that can be used to be connected to the circuit board to realize the connection between the chip package structure and the circuit board.

Figure 10:
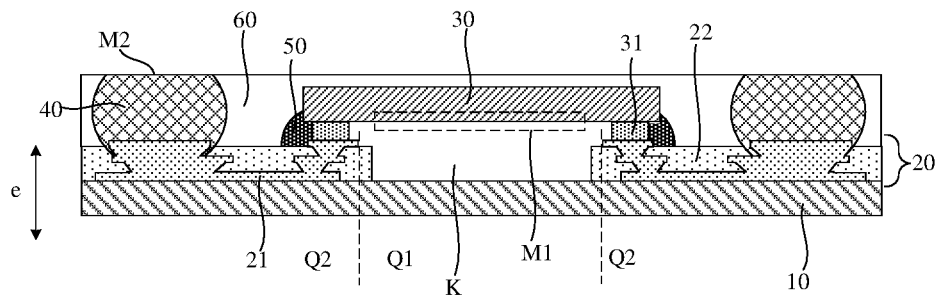
FIG. 10 is a schematic cross-sectional view of another chip package structure provided by an embodiment of the present disclosure.

FIG. 10 is a schematic cross-sectional view of another chip package structure provided by an embodiment of the present disclosure. As shown in FIG. 10, the chip package structure further includes an encapsulation layer 60, a surface M2 of the second conductive bump 40 facing far away from the substrate 10 is a plane, the encapsulation layer 60 encapsulates the chip, the second conductive bump 40 is embedded in the encapsulation layer 60, and the encapsulation layer 60 exposes the surface M2. When assembled into the module structure, the surface M2 of the second conductive bump 40 exposed outside the encapsulation layer 60 is equivalent to a reserved connection port, which can be used to be connected to the circuit board to realize the connection between the chip package structure and the circuit board. In the package structure provided by this embodiment, the plastic encapsulation pre-layer coated on an entire surface is polished during the manufacturing process of the encapsulation layer to reduce the thickness of the plastic encapsulation pre-layer and expose the surface M2 of the second conductive bump 40, so that the surface of the second conductive bump 40 exposed to the outside is a plane, which can make the thickness of the encapsulation layer thinner when the plastic encapsulation requirements are met. At the same time, the second conductive bump 40 can also be reserved as a connection port for binding, which can reduce the overall thickness of the chip package structure.

In an embodiment, based on the foregoing embodiment, as shown in FIG. 9, the wiring layer 20 includes an insulating layer 22 having a hollow region K, and the hollow region K and the first region Q1 overlap in a direction perpendicular to the substrate 10. When the chip 30 is a photosensitive chip and has a photosensitive region M1, the hollow region K is opposite to the photosensitive region M1. With such configuration, after light passes through the substrate 10, the light can be irradiated on the photosensitive region M1 of the chip 30 without passing through the insulating layer 22, which can reduce light loss, and increase the amount of light received by the photosensitive region of the photosensitive region M1, thereby increasing imaging quality after the chip 30 receives the light signal.

In an embodiment, the metal wire 21 comprises any one of copper, gold, silver, aluminum, molybdenum, or titanium, and the insulating layer 22 is made of any one of polyimide (PI), polyester, and fluorinated ethylene propylene.

Figure 11:
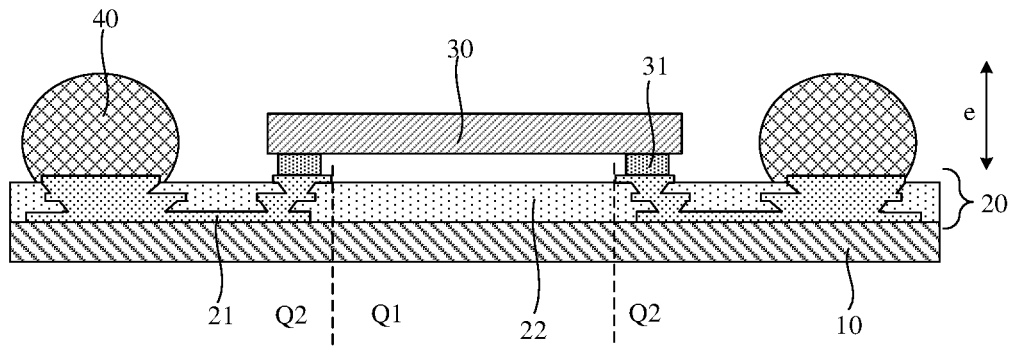
FIG. 11 is a schematic cross-sectional view of another chip package structure provided by an embodiment of the present disclosure.

In another embodiment, FIG. 11 is a schematic cross-sectional view of another chip package structure provided by an embodiment of the present disclosure. As shown in FIG. 11, the wiring layer 20 includes an insulating layer 22, and the insulating layer 22 overlaps with the first region Q1 and the second region Q2 in the direction perpendicular to the substrate 10. In this embodiment, when the wiring layer 20 is fabricated, there is no need to perform special processing on the insulating layer 22 at the position corresponding to the first region Q1, and the fabrication process of the wiring layer 20 can be simplified. In the embodiment of the present disclosure, the metal wire 21 in the wiring layer 20 overlaps with the second region Q2. When the chip 30 is a photosensitive chip, no metal wire is provided at the position corresponding to the first region Q1 to ensure the light transmittance at the corresponding position of the first region Q1. In another embodiment, a transparent wire is provided at the corresponding position of the first region Q1, and the insulating layer is used to separate the transparent wires in different layers and protect the transparent wires. The transparent wire can be made of a transparent material, such as indium tin oxide.

Figure 12:
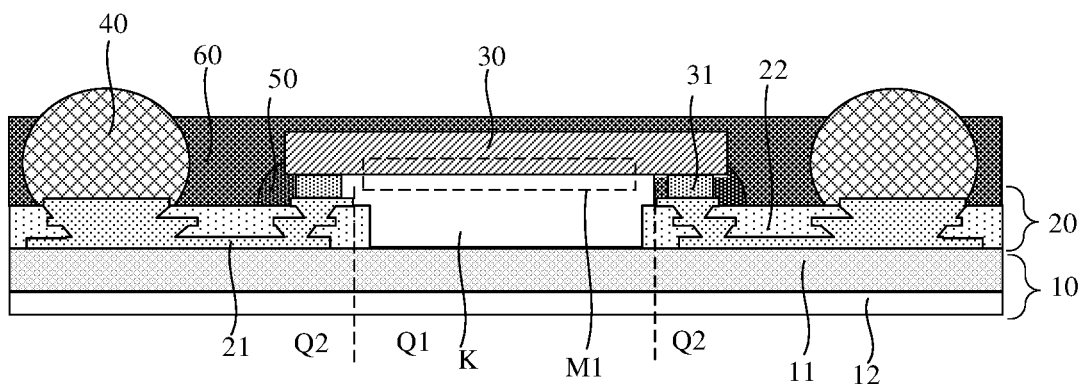
FIG. 12 is a schematic cross-sectional view of another chip package structure provided by an embodiment of the present disclosure.

In an embodiment, FIG. 12 is a schematic cross-sectional view of another chip package structure provided by an embodiment of the present disclosure. As shown in FIG. 12, the substrate 10 further includes a filter layer 12 located on a side of the glass substrate 11 facing away from the wiring layer 20. In the application, the light reaches the photosensitive region M1 after being filtered by the filter layer 12, which can improve the imaging quality of the chip 30 after receiving the light signal.

In an embodiment, the filter layer 12 is attached to a side of the glass substrate 11 by a bonding process, and the filter layer 12 and the glass substrate together form the substrate 10.

In an embodiment, the filter layer 12 is fabricated on a side of the glass substrate 11 with a film forming process to form the substrate 10.

Figure 13:
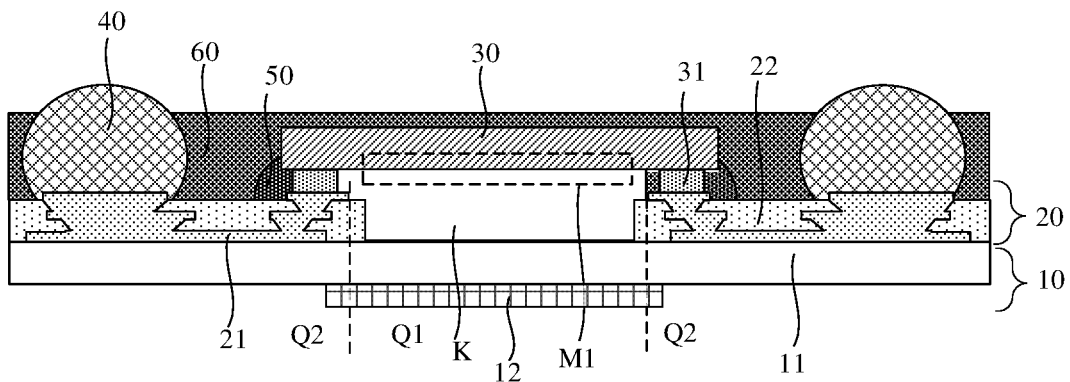
FIG. 13 is a schematic cross-sectional view of another chip package structure provided by an embodiment of the present disclosure.

In another embodiment, FIG. 13 is a schematic cross-sectional view of another chip package structure provided by an embodiment of the present disclosure. As shown in FIG. 13, the filter layer 12 is located on a side of the glass substrate 11 facing away from the wiring layer 20, the filter layer 12 is a patterned layer, and the filter layer 12 corresponds to the chip 30. In an embodiment, the filter layer 12 is directly fabricated on a side of the glass substrate 11 with the film forming process, which can ensure the alignment accuracy of the filter layer 12 and the chip 30 and ensure the performance of the chip package structure in subsequent applications. An orthographic projection of the filter layer 12 on a plane of the photosensitive region M1 covers the photosensitive region M1 to ensure that all light can be received by the photosensitive region M1 after the filter layer 12 performs functions on the light.

Figure 14:
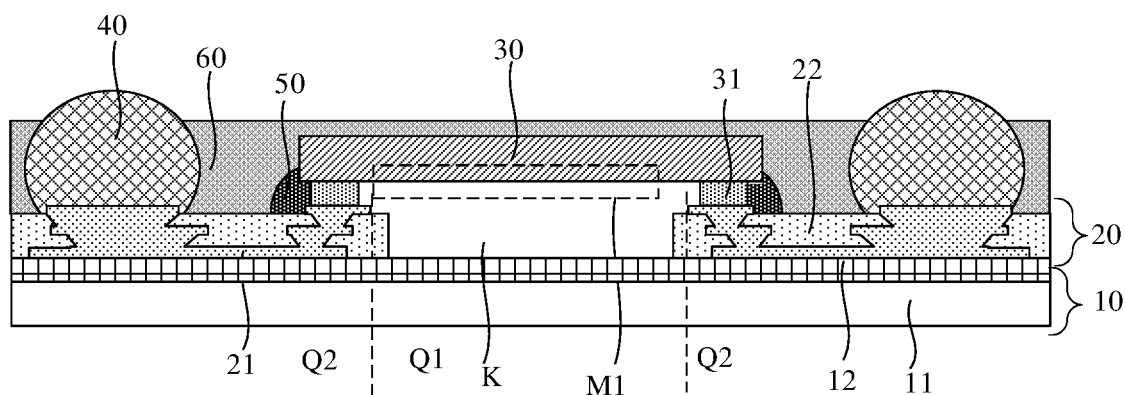
FIG. 14 is a schematic cross-sectional view of another chip package structure provided by an embodiment of the present disclosure.
Figure 15:
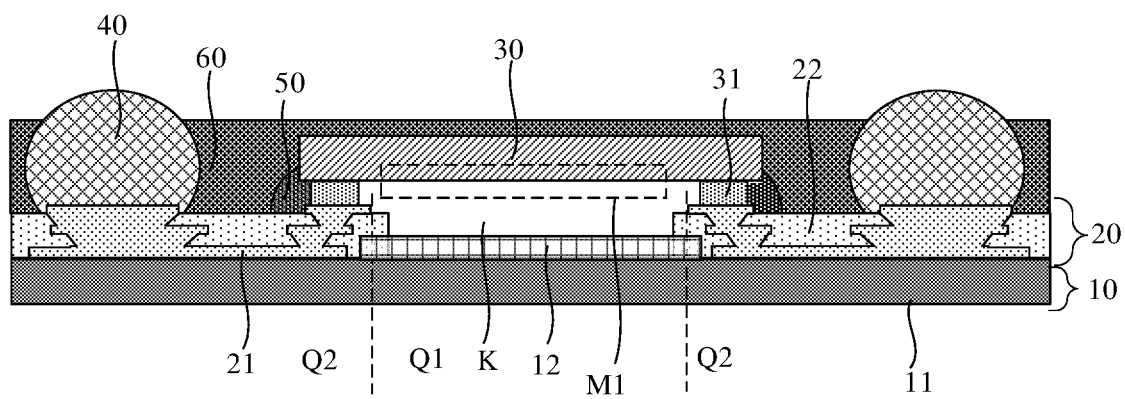
FIG. 15 is a schematic cross-sectional view of another chip package structure provided by an embodiment of the present disclosure.

FIG. 14 is a schematic cross-sectional view of another chip package structure provided by an embodiment of the present disclosure, and FIG. 15 is a schematic cross-sectional view of another chip package structure provided by an embodiment of the present disclosure. As shown in FIG. 14, the substrate 10 further includes a filter layer 12 located on a side of the glass substrate 11 facing towards the wiring layer 20. The filter layer 12 is a whole layer. In this embodiment, the filter layer 12 can be fabricated on a side of the glass substrate 11 by the film forming process, or the filter layer 12 can be attached to a side of the glass substrate.

As shown in FIG. 15, the filter layer 12 is located on the side of the glass substrate 11 facing towards the wiring layer 20, is a patterned layer, and corresponds to the chip 30. In this embodiment, the filter layer 12 can be directly fabricated on a side of the glass substrate 11 by the film forming process, which can ensure the alignment accuracy of the filter layer 12 and the chip 30 and ensure the performance of the chip package structure in subsequent applications. The orthographic projection of the filter layer 12 on the plane of the photosensitive region M1 covers the photosensitive region M1 to ensure that all light can be received by the photosensitive region M1 after the filter layer 12 performs functions on the light. With such configuration, the filter layer 12 is located in a cell of the package structure. When the package structure is impacted or squeezed by an external force, the filter layer 12 can be effectively protected to prevent it from detaching.

In an embodiment, the filter layer 12 is an infrared filter layer.

Figure 16:
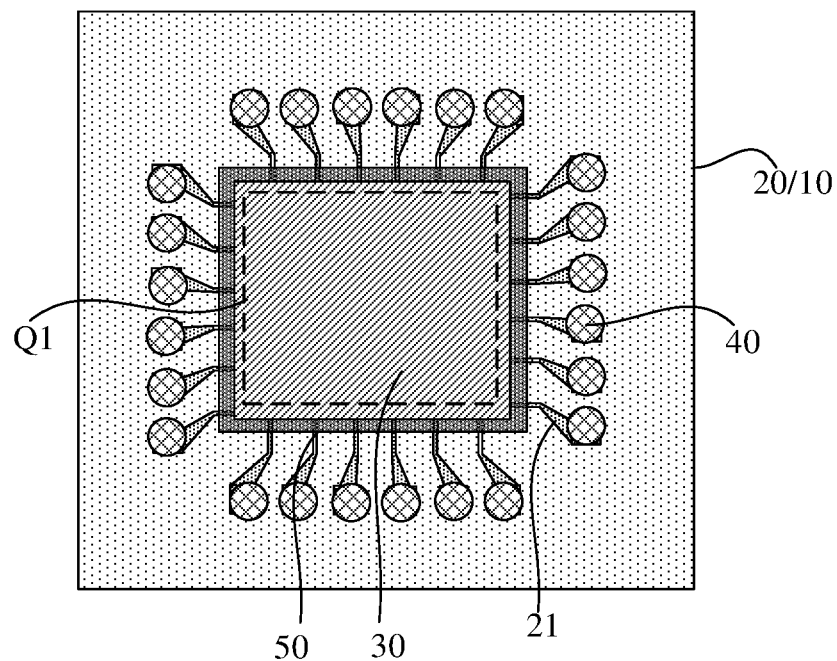
FIG. 16 is a schematic diagram of another chip package structure provided by an embodiment of the present disclosure.

In another embodiment, FIG. 16 is a schematic diagram of another chip package structure provided by an embodiment of the present disclosure, and FIG. 16 is a schematic top view from the chip 30 to a side of the substrate 10. The chip 30 in FIG. 16 is located in an upper part, the substrate 10 is located at the bottom layer, and the chip 30 is arranged on the substrate 10. The top view direction is the same as the projection direction of the orthographic projection on the substrate 10, so the metal wire 21 overlaps its orthographic projection on the substrate 10 in the top view. As shown in FIG. 16, the second conductive bump 40 corresponds to the metal wire 21, and the orthographic projections of the plurality of metal wires 21 on the substrate 10 surround the first region Q1 (the region enclosed by a dashed line in the figure is the first region Q1). In this embodiment, multiple second conductive bumps 40 surround the chip 30. The second conductive bumps 40 are used to realize a connection of the chip 30 to the external circuit. In practice, the arrangement of the second conductive bumps 40 can be designed according to specific application scenarios of the chip package structure. For example, according to the number of input/output ports of the chip and the binding requirements of the chip package structure and the circuit board, in the embodiment of FIG. 1, FIG. 4, or FIG. 7, the second conductive bumps 40 are arranged near the two opposite sides of the chip 30, or the second conductive bumps 40 can be arranged near the two adjacent sides of the chip 30; or the second conductive bumps 40 can be arranged around the chip 30, which is shown in FIG. 16.

Figure 17:
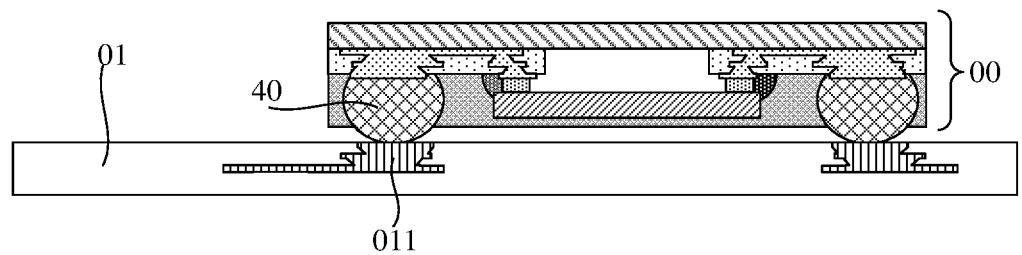
FIG. 17 is a schematic diagram of a module provided by an embodiment of the present disclosure.

An embodiment of the present disclosure also provides a module. FIG. 17 is a schematic diagram of a module provided by an embodiment of the present disclosure. As shown in FIG. 17, the module includes a circuit board 01 and a chip package structure 00 provided by any of the foregoing embodiments of the present disclosure. The chip package structure 00 is electrically connected to the circuit board 01 through the second conductive bumps 40. The circuit wire 011 in the circuit board 01 is simplified and shown in FIG. 17. The chip package structure 00 is connected to the circuit board 01, provides input signals to the chip 30 through the circuit board 01, and receives output signals fed back by the chip 30. The module provided by the embodiment of the present disclosure has a lighter and thinner thickness and a more compact size, which can achieve a high-density integration.

In an embodiment, the circuit board 01 is a printed circuit board (PCB) or a flexible circuit board (FPC). In an embodiment, the circuit board 01 includes a glass substrate and circuit wires fabricated on the glass substrate by the film forming process. On the one hand, the thickness of the glass substrate is relatively thin, which is beneficial to reduce the overall thickness of the module; on the other hand, a higher accuracy of the circuit wire is achieved by using the film forming process.

Figure 18:
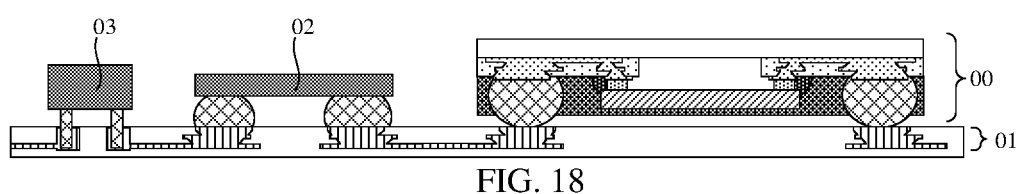
FIG. 18 is a schematic diagram of another module provided by an embodiment of the present disclosure.

In another embodiment, FIG. 18 is a schematic diagram of another module provided by an embodiment of the present disclosure. As shown in FIG. 18, the module further includes a control chip 02 fixed on the circuit board 01. The control chip 02 is bound to the circuit board 01 through pins. The chip package structure 00 is bound to the circuit board 01 through the second conductive bumps 40, so that the chip 30 is electrically connected to a circuit wire of the circuit board 01, and then connected to the control chip 02 through circuit wires.

As shown in FIG. 18, the module also includes a passive device 03 fixed on the circuit board 01. The passive device 03 is bound to the circuit board 01 through pins. The passive device 03 includes a resistor or a capacitor. The passive device 03 is connected to the control chip 02 through the circuit wire of the circuit board 01, and the passive device 03 is connected to the control chip 02 to form a filter circuit or a signal amplifying circuit, which can be configured to process electrical signals fed back by the chip 30.

Figure 19:
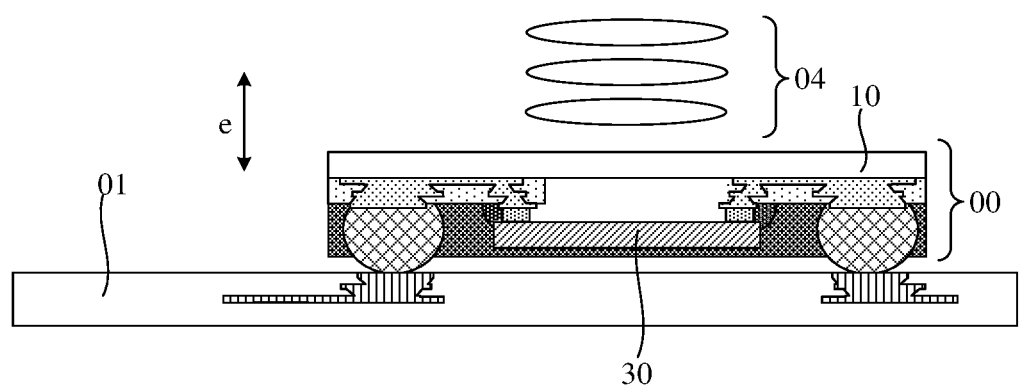
FIG. 19 is a schematic diagram of another module provided by an embodiment of the present disclosure.

FIG. 19 is a schematic diagram of another module provided by an embodiment of the present disclosure. As shown in FIG. 19, the module further includes a lens group, and the lens group 04 is located on a side of the substrate 10 facing away from the chip 30. The lens group 04 overlaps with the chip 30 in the direction e perpendicular to the substrate 10. The lens group 04 includes at least two lenses that are stacked. The chip package structure 30 and the lens group 04 that are provided by the embodiment of the present disclosure can form a camera module, and can provide a thinner camera module.

Figure 20:
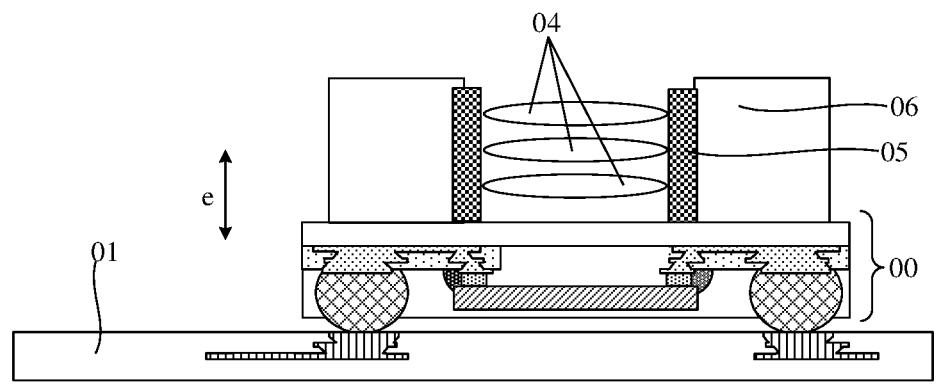
FIG. 20 is a schematic diagram of another module provided by an embodiment of the present disclosure.

In another embodiment, FIG. 20 is a schematic diagram of another module provided by an embodiment of the present disclosure. As shown in FIG. 20, the module further includes a focus motor 05, which is used to drive the lenses in the lens group 04 to make relative motion. The focus motor 05 is fixed on a housing 06. The focus motor 05 can adjust an imaging focal length and improve the application performance of the camera module.

Based on the same inventive concept, an embodiment of the present disclosure also provides an electronic device, which includes a camera module and a driving chip, and the driving chip is configured to generate an image according to the electrical signal converted by the photosensitive chip in the camera module. Of course, the display device can be any electronic device with a display function, such as a mobile phone, a notebook computer, or a video camera.

Figure 21:
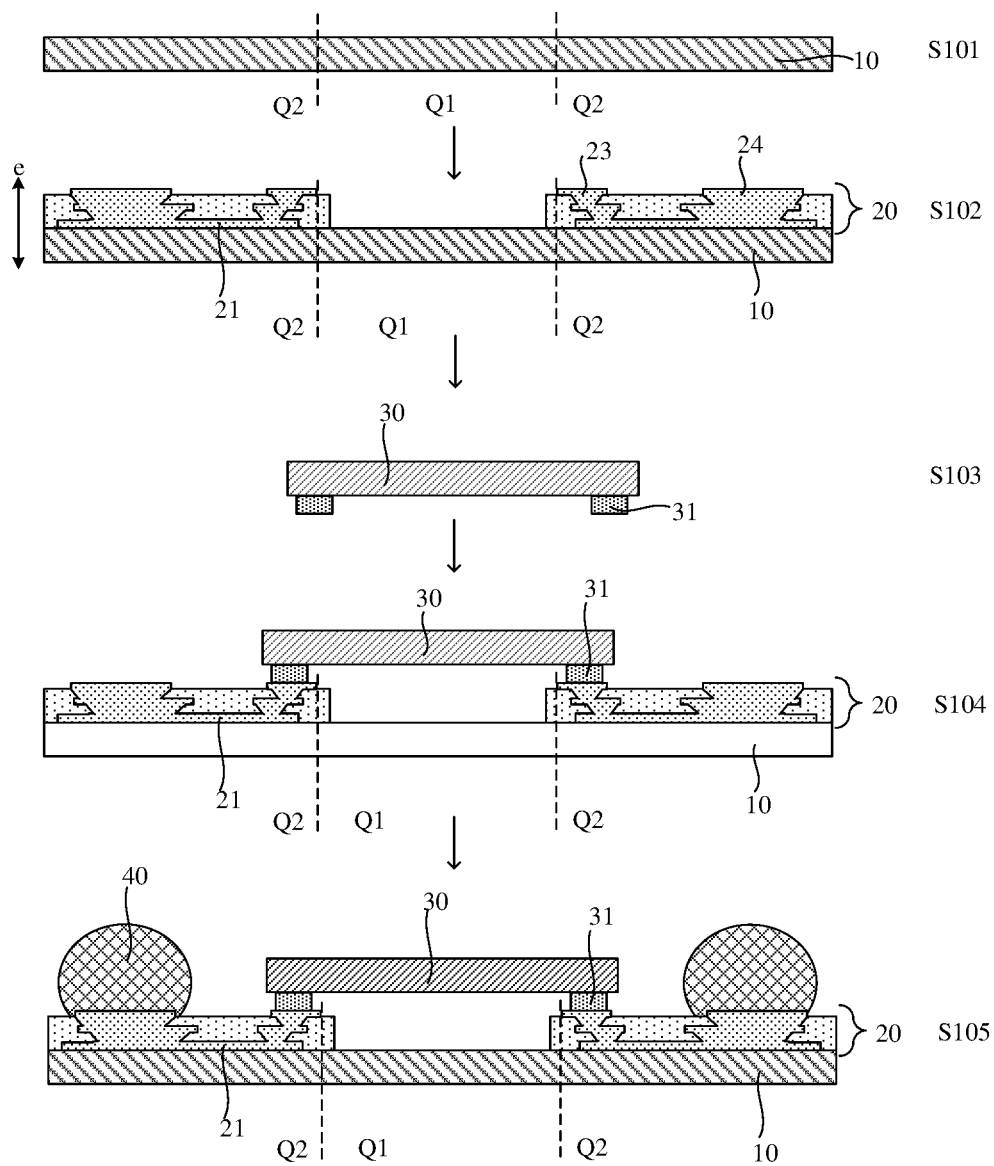
FIG. 21 is a flowchart of a method for manufacturing a chip package structure provided by an embodiment of the present disclosure.

An embodiment of the present disclosure also provides a method for manufacturing a chip package structure, which is used to manufacture the chip package structure provided by any embodiment of the present disclosure. FIG. 21 is a flowchart of the method for manufacturing the chip package structure provided by an embodiment of the present disclosure. As shown in FIG. 21, the manufacturing method includes steps 101, 102, 103, 104, and 105.

At step S101, a substrate 10 is provided. The substrate 10 includes a first region Q1 and a second region Q2 surrounding the first region Q1.

At step S102, a wiring layer 20 is fabricated on the substrate 10 with a film forming process. The wiring layer 20 includes a metal wire 21. At least part of the metal wire 21 is in contact with the substrate 10, and the metal wire 21 overlaps with the second region Q2 in a direction e perpendicular to the substrate 10. After the wiring layer 20 is fabricated, the first pad 24 and the second pad 23 are formed at the same time. A size of the first pad 24 is larger than the size of the second pad 23, and the size here refers to an area of the pad. In the subsequent process, the first pad 24 is used to be connected to the second conductive bump 40, and the second pad 23 is used to be connected to the first conductive bump 31 on the chip 30.

Figure 22:
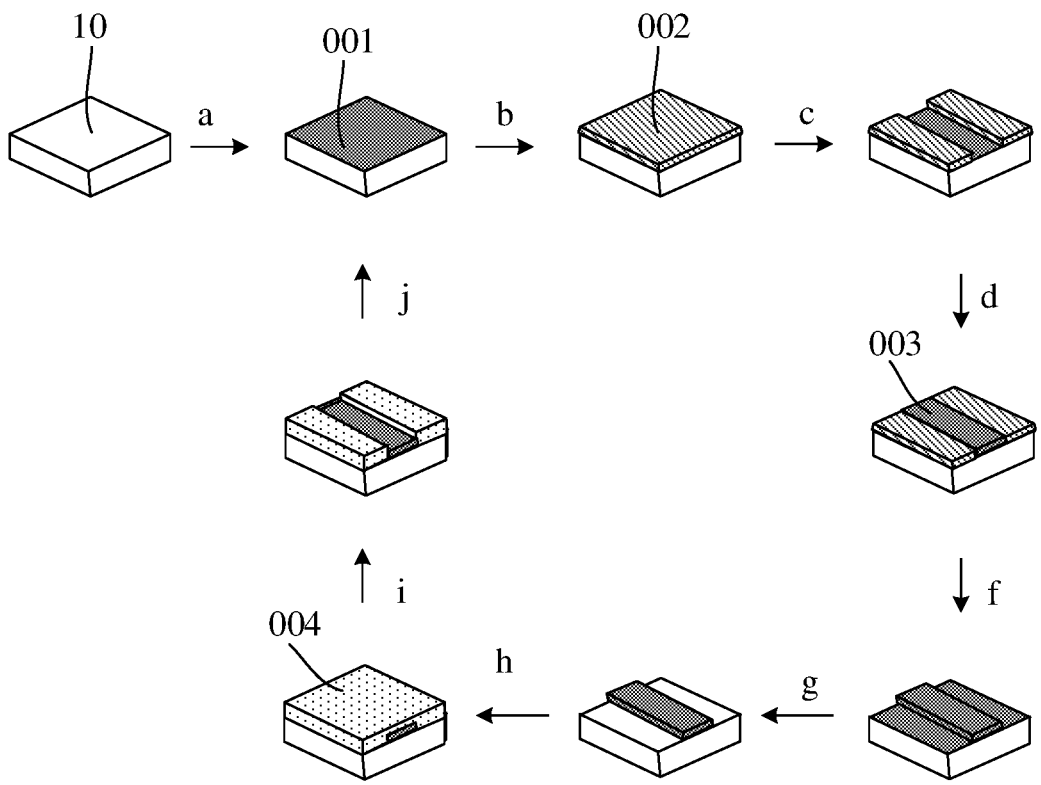
FIG. 22 is flow chart for manufacturing a wiring layer according to an embodiment of the present disclosure.

In an embodiment, the wiring layer 20 is made by magnetron sputtering, electroplating process, and photolithography process. FIG. 22 is a flow chart of manufacturing of the wiring layer. As shown in FIG. 22, the manufacturing process of the wiring layer 20 includes: step a, fabricating a copper seed layer 001 on the substrate 10 through the magnetron sputtering process; step b, coating the copper seed layer 001 with photoresist 002; step c, according to the shape of the metal wire 21 in the wiring layer 20, performing an exposure-development process on the photoresist 002 so that the photoresist 002 forms an opening, where the opening is exposed out copper seed layer 001 and has a same shape as the metal wire 21; then step d, electroplating copper 003 in the opening; step f, removing the photoresist 002; step g, removing excess copper seed layer 001 by wet etching; step h, coating insulating layer 004 (forming the insulating layer 22 in the wiring layer 20 after the overall process); step i, etching the insulating layer 004 to form openings; step j, sputtering to continue to form the copper seed layer 001 on the insulating layer 004. The above steps a to g can be performed to obtain the wiring layer 20 made of a single metal layer. The above steps a to j can be repeated to obtain the wiring layer 20 made of multiple metal layers. It should be noted that FIG. 22 only describes the manufacturing process of the metal wire 21 in the wiring layer, and FIG. 22 does not limit the pattern shape of the metal wire 21.

At step S103, a chip 30 is provided, where the chip 30 includes a first conductive bump 31 on a side of the chip 30.

At step S104, the chip 30 with the first conductive bump 31 is attached to the wiring layer 20, where the chip 30 corresponds to the first region Q1, and the first conductive bumps 31 are electrically connected to the metal wires 21. The chip 30 is a flip-mounted chip, and then is connected to the second pads on the wiring layer 20 through the first conductive bumps 31, so that the first conductive bump 31 is connected to the metal wire 21 via the second pad.

At step S105, a second conductive bump 40 is fabricated. The second conductive bump 40 is electrically connected to the metal wire 21, and the second conductive bumps 40 and the chip 30 do not overlap in the direction perpendicular to the substrate 10. In an embodiment, the second conductive bump 40 is electrically connected to the metal wire 21 through the first pad.

With such manufacturing method provided by the embodiment of the present disclosure, the wiring layer 20 is directly fabricated on the substrate 10 with the film forming process, and then the attach chip 30 and the wiring layer 20, the physical signal of the chip 30 is transmitted to the second conductive bumps 40 on the substrate 10 through the metal wire 21, thereby packaging the chip 30. The substrate 10 and the wiring layer 20 do not need to be bonded by an adhesive layer, and the substrate 10 does not need to be provided with grooves similar to those in the prior art to carry chips. The chip package structure manufactured by the manufacturing method provided by the embodiment of the present disclosure has a lighter and thinner thickness and a more compact size, which is beneficial to the high-density integration application.

As shown in the embodiment of FIG. 21, during production, step S104 is first performed to attach the chip 30 and the wiring layer 20, and then step S105 is performed to fabricate the second conductive bump 40. In another embodiment, step S105 can be performed first to fabricate the second conductive bump 40 and then connected the second conductive bump 40 and the metal wire 21 in the wiring layer 20, and then step S104 is performed to attach the chip 30 and the wiring layer 20.

In an embodiment, providing the chip 30 in the step S103 includes providing a chip matrix, and forming the first conductive bump 31 on a side of the chip matrix with the photosensitive region. In the chip package structure obtained by using the manufacturing method provided in this embodiment, the chip 30 includes a photosensitive region M1, as shown in FIG. 3. After step S104, the photosensitive region M1 of the chip 30 is opposite to the substrate 10, that is, the photosensitive region M1 is located on a side of the chip 30 facing towards the substrate 10.

Figure 23:
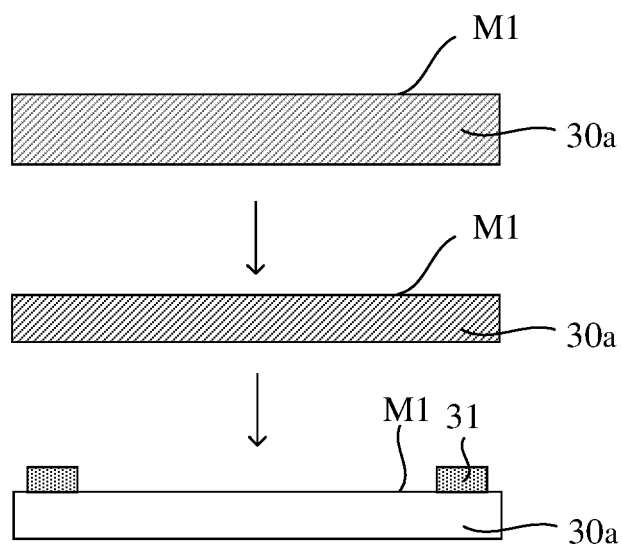
FIG. 23 is a flowchart of a preprocessing method of a chip in an embodiment of the present disclosure.

In an embodiment, FIG. 23 is a flow chart of a preprocessing method of a chip in an embodiment of the present disclosure. As shown in FIG. 23, the specific process of providing the chip in step S103 includes: providing the chip matrix 30a, and thinning a back side of the photosensitive region M1 of the chip matrix 30a to thin the chip matrix 30a; then forming the first conductive bump 31 on a side of the chip matrix 30a with the photosensitive region M1. In an embodiment, the first conductive bump 31 is formed at a position of the chip matrix 30a corresponding to the input/output port by processes, such as, photolithography and electroplating. In this embodiment, the chip matrix is thinned to reduce the overall thickness of the chip package structure.

In some embodiments, the wiring layer 20 includes an insulating layer 22, and fabricating the wiring layer 20 on the substrate 10 by the film forming process in step S102, further includes: etching the insulating layer 22 to form a hollow region K overlapping the first region Q1 in the direction perpendicular to the substrate 10. According to the process requirements of the metal wire 21, the wiring layer 20 can include two or more insulating layers. In an embodiment, after the process of the metal wire 21 of the wiring layer 20 is completed, all the insulating layers in the wiring layer 20 can be etched at a position corresponding to the first region Q1 to form the hollow region K. In another embodiment, each time an insulating layer is formed, it is etched to form a corresponding hollow region.

The chip package structure manufactured by this embodiment can refer to the above-mentioned schematic diagram in FIG. 9. By providing the hollow region K in the insulating layer 22, after the light passes through the substrate 10, it can be irradiated to the photosensitive of the chip 30 without passing through the insulating layer 22, which can reduce light loss, and increase the amount of light received by the photosensitive region of the photosensitive region M1, thereby improving the imaging quality of the chip 30 after receiving the light signal.

In some embodiments, after step S104, the method for manufacturing the chip package structure further includes filling peripheral edges of the chip 30 with a filling adhesive 50, which is filled on the peripheral edges of the chip 30 and is in contact with the wiring layer 20. The chip package structure produced by this embodiment can refer to the above-mentioned schematic diagram in FIG. 7 or FIG. 8. The filling adhesive 51 can not only make the bonding between the chip 30 and the wiring layer 20 more reliable, but also prevent impurities from entering the region between the chip 30 and the substrate 10. When the surface of the chip 30 facing towards the substrate 10 is a functional surface (such as a photosensitive region), the filling adhesive 51 can protect this surface of the chip 30.

In some embodiments, after step S105, a coating process is used to form an encapsulation layer. The encapsulation layer encapsulates the chip 30, and the second end 42 of the second conductive bump 40 is embedded in the encapsulation layer 60, and the first end 41 of the conductive bump 40 is exposed outside the encapsulation layer 60, and the encapsulation layer also encapsulates other regions of the wiring layer 20.

Figure 24:
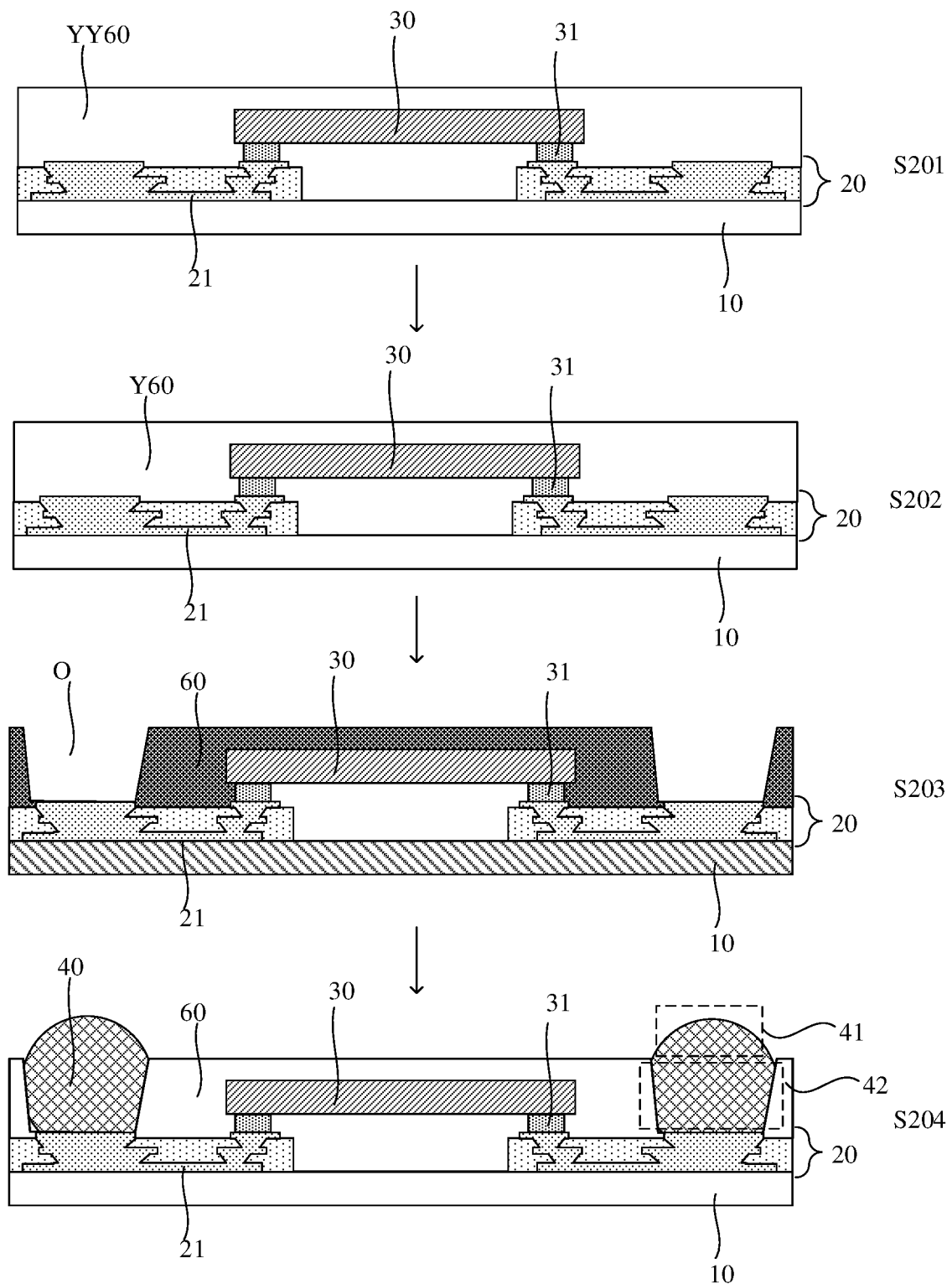
FIG. 24 is a flowchart of another method for manufacturing a chip package structure according to an embodiment of the present disclosure.

In some embodiments, the encapsulation layer is formed before the second conductive bumps are formed. FIG. 24 is a flowchart of another method for manufacturing a chip package structure according to an embodiment of the present disclosure. As shown in FIG. 24, the manufacturing method includes:

Step S201: coating a plastic encapsulation material YY60 encapsulating the chip 30 and the wiring layer 20;

Step S202: curing the plastic encapsulation material YY60 to form a plastic encapsulation pre-layer Y60;

Step S203: perforating the plastic encapsulation pre-layer Y60 with a hole to form the encapsulation layer 60, the hole O exposing the first pad; and Step S204: fabricating a second conductive bump 40 in the hole O. In an embodiment, the hole O has a shape same as the shape of the first pad to ensure completely expose the first pad. The second conductive bump 40 includes a first end 41 and a second end 42 that are connected to each other. The second end 42 is embedded in the encapsulation layer 60, and the first end 41 is exposed outside the encapsulation layer 60. In an embodiment, the second conductive bump 40 is formed in the hole O by using a ball planting process.

The encapsulation layer 60 encapsulates and protects the entire chip 30 on the side of the chip 30 facing away from the substrate 10, and the encapsulation layer 60 wraps a part of the second conductive bump 40 to ensure a firm and reliable connection between the second conductive bump 40 and the metal wire 21. When assembling the module structure, the first end exposed outside the encapsulation layer 60 is equivalent to a reserved connection port, which can be used to be connected to the circuit board to realize the connection between the chip package structure and the circuit board.

Figure 25:
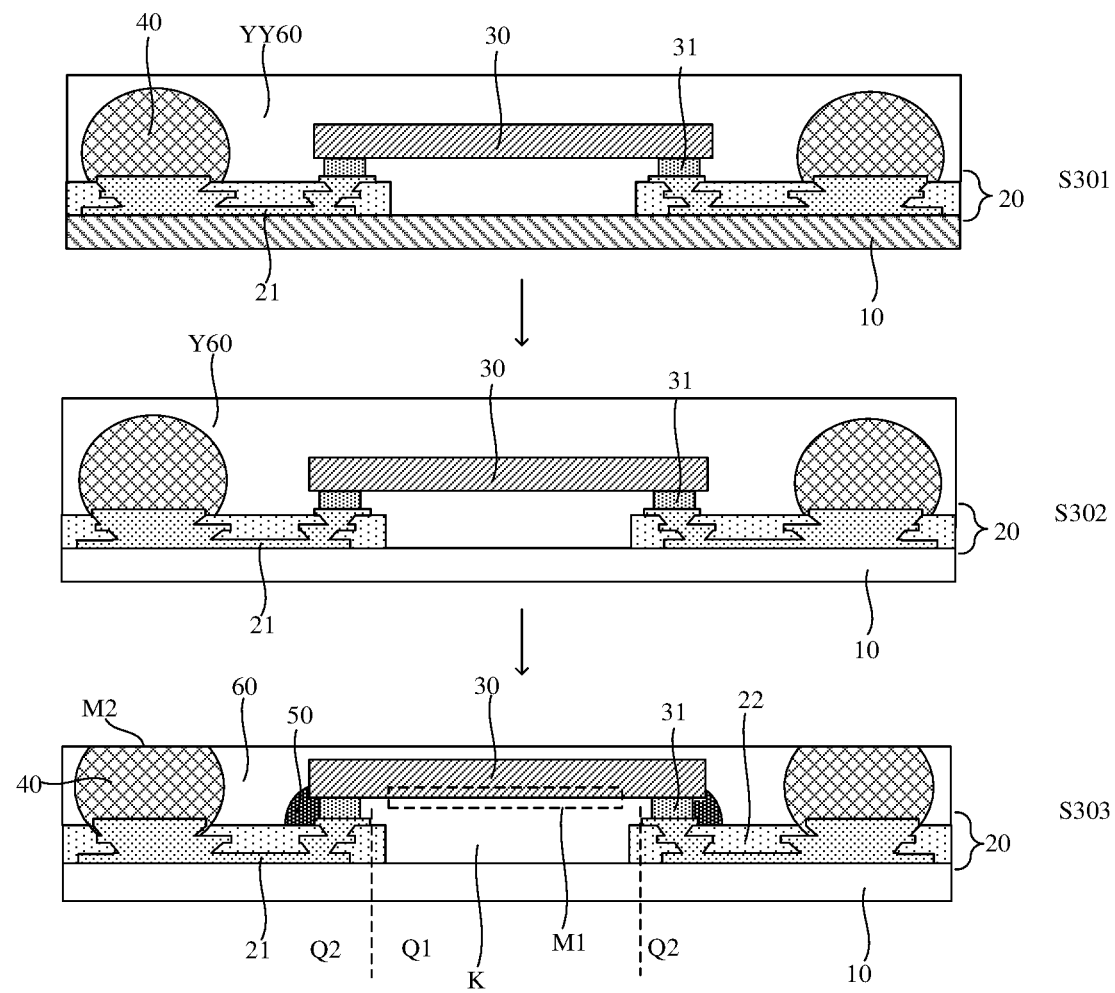
FIG. 25 is a flowchart of another method for manufacturing a chip package structure according to an embodiment of the present disclosure.

In some embodiments, the encapsulation layer is formed after the second conductive bumps are formed. FIG. 25 is a flowchart of another method for manufacturing a chip package structure according to an embodiment of the present disclosure. As shown in FIG. 25, the manufacturing method includes:

Step S301: coating the plastic encapsulation material YY60 encapsulating the chip 30 and the second conductive bump 40;

Step S302: curing the plastic encapsulation material YY60 to form a plastic encapsulation pre-layer Y60;

Step S303: polishing the plastic encapsulation pre-layer Y60 to form the encapsulation layer 60 exposing a surface of the second conductive bump 40 facing away from the substrate.

The chip package structure manufactured by this embodiment can be referred to the schematic diagram in FIG. 10. When assembled into a module structure, the surface of the second conductive bump 40 exposed outside the encapsulation layer 60 is equivalent to a reserved connection port, which can be used to be connected to the circuit board to realize the connection between the chip package structure and the circuit board.

The above illustrate some embodiments of the present disclosure and are not intended to limit the present disclosure. Any modifications, equivalent replacements, improvements, etc., which are made within the spirit and principles of the present disclosure, should be fall within the scope of the present disclosure.

Finally, it should be noted that the above embodiments are only used to illustrate the technical solutions of the present disclosure, not to limit them; although the present disclosure has been described in detail with reference to the foregoing embodiments, those skilled in the art should understand that they can still modify the technical solutions recorded in the foregoing embodiments make equivalent replacements to some or all of the technical features, and these modifications or replacements do not cause the essence of the corresponding technical solutions to deviate from the scope of the technical solutions of the embodiments of the present disclosure.

What is claimed is:

1. A chip package structure, comprising:
a substrate comprising a first region and a second region surrounding the first region;
a wiring layer located on a side of the substrate and comprising at least one metal wire, wherein at least part of a metal wire of the at least one metal wire is in contact with the substrate, and wherein the at least one metal wire overlaps with the second region in a direction perpendicular to the substrate;
a chip located on a side of the wiring layer facing away from the substrate, wherein the chip corresponds to the first region, wherein the chip comprises a first conductive bump disposed on a side of the chip facing towards to the substrate, and wherein the first conductive bump is electrically connected to one of the at least one metal wire; and
a second conductive bump electrically connected to one of the at least one metal wire, wherein the second conductive bump does not overlap with the chip in the direction perpendicular to the substrate;
wherein the chip comprises a photosensitive region located at the side of the chip facing towards the substrate and opposite to the first region, and wherein the photosensitive region does not overlap with the metal wire in the wiring layer.

2. The chip package structure of claim 1, further comprising:
a light-shielding portion located on a side of the substrate facing towards the chip or a side of the substrate facing away from the chip,
wherein an orthographic projection of the light-shielding portion on a plane of the photosensitive region surrounds the photosensitive region and does not overlap with the photosensitive region.

3. The chip package structure of claim 1, further comprising:
a filling adhesive filled on periphery edges of the chip and in contact with the wiring layer.

4. The chip package structure of claim 1, further comprising:
an encapsulation layer, wherein the second conductive bump comprises a first end and a second end that are connected to each other, wherein the first end is located at a side of the second end away from the substrate; and the encapsulation layer encapsulates the chip, wherein the second end is embedded in the encapsulation layer, and wherein the first end is exposed outside the encapsulation layer.

5. The chip package structure of claim 1, further comprising:
an encapsulation layer, wherein a surface of the second conductive bump faces away from the substrate is a plane, wherein the encapsulation layer encapsulates the chip, wherein the second conductive bump is embedded in the encapsulation layer, and wherein the encapsulation layer exposes the surface of the second conductive bump facing away from the substrate.

6. The chip package structure of claim 1, wherein the wiring layer comprises an insulating layer, and wherein the insulating layer overlaps with the first region and the second region in the direction perpendicular to the substrate.

7. The chip package structure of claim 1, wherein the wiring layer comprises an insulating layer having a hollow region, and wherein the hollow region overlaps with the first region in the direction perpendicular to the substrate.

8. The chip package structure of claim 1, wherein the substrate comprises a glass substrate.

9. The chip package structure of claim 8, wherein the substrate further comprises a filter layer located on a side of the glass substrate facing towards the wiring layer.

10. The chip package structure of claim 8, wherein the substrate further comprises a filter layer located on a side of the glass substrate facing away from the wiring layer.

11. The chip package structure of claim 1, wherein the substrate has a thickness d, where $0.05$ mm$\leq$d$\leq$$0.7$ mm.

12. The chip package structure of claim 1, wherein the at least one metal wire comprises a plurality of metal wires, wherein the second conductive bump corresponds to a metal wire of the plurality of metal wires, and wherein orthographic projections of metal wires of the plurality of metal wires on the substrate surround the first region.

13. A module, comprising:
a circuit board;
a chip package structure, comprising:
a substrate comprising a first region and a second region surrounding the first region;
a wiring layer located on a side of the substrate and comprising at least one metal wire, wherein at least part of a metal wire of the at least one metal wire is in contact with the substrate, and wherein the at least one metal wire overlaps with the second region in a direction perpendicular to the substrate;
a chip located on a side of the wiring layer facing away from the substrate, wherein the chip corresponds to the first region, wherein the chip comprises a first conductive bump provided on a side of the chip facing towards to the substrate, and wherein the first conductive bump is electrically connected to a metal wire of the at least one metal wire; and
a second conductive bump electrically connected to a metal wire of the at least one metal wire, wherein the second conductive bump does not overlap with the chip in the direction perpendicular to the substrate, and wherein the chip package structure is electrically connected to the circuit board through the second conductive bump;
a control chip fixed on the circuit board;
a passive device fixed on the circuit board;
a lens group located at a side of the substrate facing away from the chip, wherein the lens group overlaps with the chip in the direction perpendicular to the substrate; and
a focus motor configured to drive lenses of the lens group to make a relative movement;
wherein the chip comprises a photosensitive region located at the side of the chip facing towards the substrate and opposite to the first region, and wherein the photosensitive region does not overlap with the metal wire in the wiring layer.

14. A method for manufacturing a chip package structure, comprising:
providing a substrate, the substrate comprising a first region and a second region surrounding the first region;
fabricating a wiring layer on the substrate by a film forming process, wherein the wiring layer comprises at least one metal wire, wherein at least part of a metal wire of the at least one metal wire is in contact with the substrate, and wherein the at least one metal wire overlaps with the second region in a direction perpendicular to the substrate;
providing a chip with a first conductive bump arranged on a side of the chip;
attaching the wiring layer and the chip with the first conductive bump, wherein the chip corresponds to the first region, and wherein the first conductive bump is electrically connected to a metal wire of the at least one metal wire; and
fabricating a second conductive bump, wherein the second conductive bump is electrically connected to a metal wire of the at least one metal wire;
wherein the chip comprises a photosensitive region located at the side of the chip facing towards the substrate and opposite to the first region, and wherein the photosensitive region does not overlap with the metal wire in the wiring layer.

15. The method for manufacturing a chip package structure according to claim 14, wherein the chip comprises a photosensitive region; and
wherein said providing the chip comprises:
providing a chip matrix and fabricating the first conductive bump on a side of the chip matrix comprising the photosensitive region, and
providing the chip matrix and thinning a back side of the photosensitive region of the chip matrix to thin the chip matrix.

16. The method for manufacturing a chip package structure according to claim 14, wherein the wiring layer comprises an insulating layer; and
wherein said fabricating the wiring layer on the substrate by the film forming process further comprises: etching the insulating layer to form a hollow region, wherein the hollow region overlaps with the first region in the direction perpendicular to the substrate.

17. The method for manufacturing a chip package structure according to claim 14, further comprising, after attaching the wiring layer and the chip with the first conductive bump:

filling peripheral edges of the chip with filling adhesive, wherein the filling adhesive is filled on the peripheral edges of the chip and in contact with the wiring layer.

18. The method for manufacturing a chip package structure according to claim 14, wherein the substrate comprises a first pad, and wherein the second conductive bump is electrically connected to one of the at least one metal wire through the first pad;

wherein the method further comprises, before fabricating the second conductive bump:

coating a plastic encapsulation material and the plastic encapsulation material encapsulating the chip and the wiring layer;

curing the plastic encapsulation material to form a plastic encapsulation pre-layer; and perforating the plastic encapsulation pre-layer with a hole to form an encapsulation layer, the hole exposing the first pad; and wherein said fabricating the second conductive bump comprises:

fabricating the second conductive bump in the hole, wherein the second conductive bump comprises a first end and a second end that are connected to each other, wherein the second end is embedded in the encapsulation layer, and wherein the first end is exposed outside the encapsulation layer.

19. The method for manufacturing a chip package structure according to claim 14, further comprising, after fabricating the second conductive bump, coating a plastic encapsulation material and the plastic encapsulation material encapsulating the chip and the second conductive bump;

curing the plastic encapsulation material to form a plastic encapsulation pre-layer; and polishing the plastic encapsulation pre-layer to form an encapsulation layer, wherein the encapsulation layer exposes a surface of the second conductive bump facing away from the substrate.

\* \* \* \* \*